United States Patent
Choi et al.

(10) Patent No.: US 7,079,445 B2
(45) Date of Patent: Jul. 18, 2006

(54) FLASH MEMORY PIPELINED BURST READ OPERATION CIRCUIT, METHOD, AND SYSTEM

(75) Inventors: Soo-Hwan Choi, Kyungki-do (KR); Jung-Hoon Park, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 214 days.

(21) Appl. No.: 10/852,841

(22) Filed: May 24, 2004

(65) Prior Publication Data

US 2005/0018480 A1    Jan. 27, 2005

(30) Foreign Application Priority Data

Jul. 22, 2003   (KR) ...................... 10-2003-0050227

(51) Int. Cl.
*G11C 7/00*       (2006.01)
(52) U.S. Cl. .................... 365/233; 365/238.5
(58) Field of Classification Search ............... 365/233, 365/238.5, 239
See application file for complete search history.

(56) References Cited

U.S. PATENT DOCUMENTS

| | | | |
|---|---|---|---|
| 5,790,831 A * | 8/1998 | Lin et al. ..................... | 710/315 |
| 5,798,980 A * | 8/1998 | McClure ..................... | 365/233 |
| 6,216,180 B1 | 4/2001 | Kendall et al. | |
| 6,457,075 B1 * | 9/2002 | Koutsoures .................. | 710/35 |

OTHER PUBLICATIONS

Datasheets and Specifications Samsung Electronics, "*8 M x *8 Bit NAND Flash Memory*"; pp. 1-29; www.samsung.com/Products/Semiconductor/Flash/Technicalinfo/datasheets.htm.

* cited by examiner

*Primary Examiner*—Vu A. Le
(74) *Attorney, Agent, or Firm*—Marger Johnson & McCollom, P.C.

(57) ABSTRACT

Method and apparatus for use with flash memory devices and systems are included among the embodiments. In exemplary systems, a pipelined burst read operation allows the device to support higher data transfer rates than are possible with prior art burst read flash memory devices. Preferably, the flash memory device supports both non-pipelined and pipelined read operations, with the read mode settable from a memory controller. Other embodiments are described and claimed.

27 Claims, 7 Drawing Sheets

Fig. 1

(PRIOR ART)

Fig. 2

(PRIOR ART)

FLASH MEMORY PIPELINED BURST READ OPERATION CIRCUIT, METHOD, AND SYSTEM

RELATED APPLICATIONS

This application claims the benefit of Korean Patent Application No. P2003-50227, filed Jul. 22, 2003, the disclosure of which is incorporated herein by reference.

BACKGROUND OF THE INVENTION

1. Field of the Invention

The present invention relates to flash memory devices, methods for their operation, and systems incorporating such devices, and more specifically to pipelined burst read functionality for such devices, methods, and systems.

2. Description of the Related Art

Flash memory is a type of nonvolatile rewritable memory useful in a wide variety of digital data applications that require occasional writing and/or rewriting of data, nonvolatile storage, and relatively high-speed read capability. To increase the read speed capability, some flash memory devices include a "burst-read" or "page-read" operation. A flash memory device with this capability responds to a read request by reading a "page" of memory into an on-chip buffer, and then outputting successive data elements from this buffer in response to a group of sequential read pulses.

Figure 1:
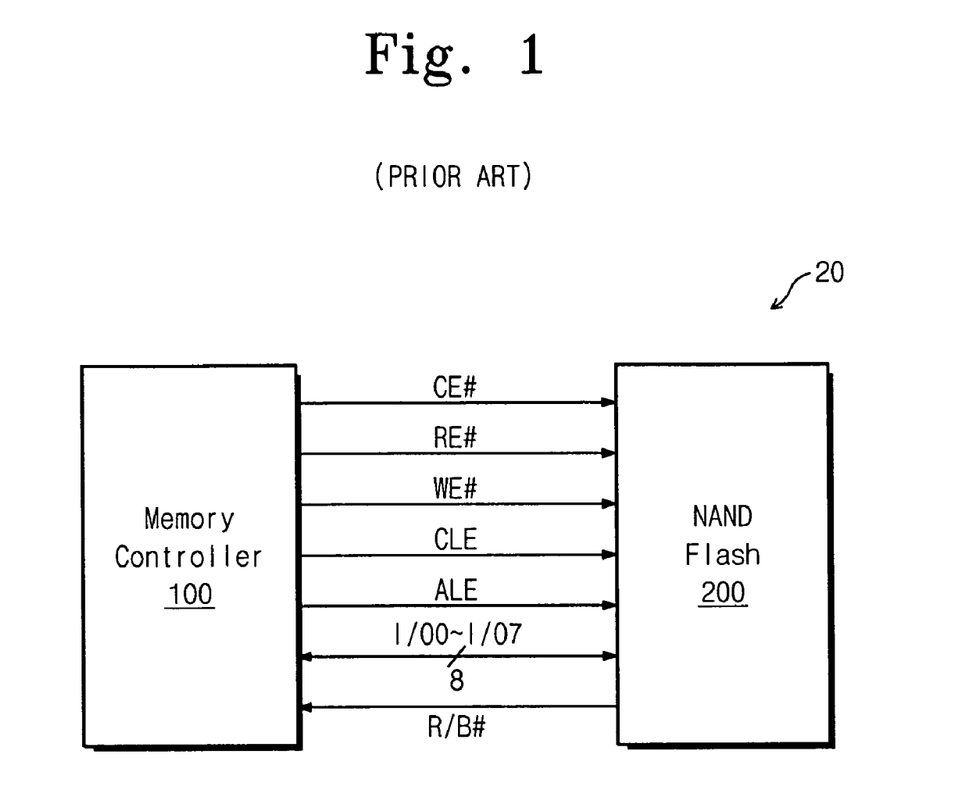
FIG. 1 illustrates a flash memory system configuration comprising a memory controller and a NAND flash memory, useful in prior art systems and in some embodiments of the present invention.
Figure 2:
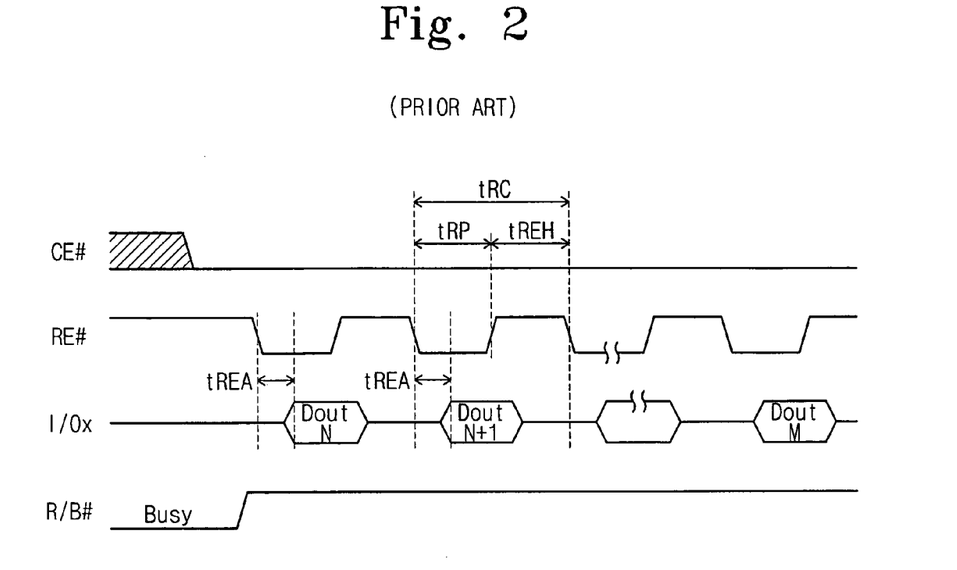
FIG. 2 illustrates a prior art flash memory non-pipelined burst read operation.

The burst read operation can be better understood with reference to FIGS. 1 and 2. FIG. 1 illustrates a basic flash memory system 20, including a memory controller 100 and a NAND flash memory device 200. Memory controller 100 supplies control signals CE#, RE#, WE#, CLE, and ALE to memory device 200. Memory controller 100 and memory device 200 also share a bi-directional input/output (I/O) bus, shown in FIG. 1 as a group of eight signal lines I/O0–I/O7. Memory device 200 also drives an R/B# signal to memory controller 200. Of course, other implementations can have different signal lines, bus widths, and/or incorporate multiple flash memory devices, but FIG. 1 illustrates basic concepts found in flash memory systems. Memory controller 100 may be a dedicated circuit or integrated into a larger circuit with additional functionality, such as a digital processor.

The control signals shown in FIG. 1 operate as follows, where "#" indicates a signal that is asserted at a logic low level. Chip enable signal CE# provides selection control: other signals can be routed to multiple memory devices, and the only device that will respond is the one to which memory controller 100 asserts CE#. Read enable signal RE# actually causes memory device 200 to drive read data onto the I/O bus when asserted. Write enable signal WE# causes memory device 200 to latch address, command, or write data off of the I/O bus on a positive transition. Command latch enable signal CLE, when asserted, causes data latched at the memory device's I/O port to be interpreted as a command. Likewise, address latch enable signal ALE, when asserted, causes data latched at the memory device's I/O port to be interpreted as address data.

Input/output signals I/O0–I/O7 are driven by memory controller 100 to transfer commands, address, and write data to memory device 200. In a read operation, I/O0–I/O7 are driven by memory device 200 to transfer read data to memory controller 100. When memory controller 100 and flash memory device 200 are not driving the I/O bus, they each place their respective drivers in a high-impedance (high-z) state.

Finally, flash memory device 200 has the capability to drive ready/busy signal R/B# to memory controller 100. Memory device 200 pulls this signal low when it is programming, erasing, or reading from the memory array.

FIG. 2 contains a timing diagram for the data transfer portion of a data read operation for system 20. Just prior to the time period depicted in FIG. 2, memory controller 100 commands memory device 200 to read data for a specific page of its memory. Flash memory device 200 pulls R/B# low while the specific page is accessed from the memory array to indicate that it is busy. When R/B# returns to a high state, memory controller 100 is permitted to take RE# low (while CE# is low) to cause memory device 200 to drive a first data element Dout N onto the I/O bus. Memory controller 100 then takes RE# high as it latches Dout N off of the I/O bus. Memory device 200 then returns the I/O bus to a high-z state and awaits a new read cycle.

Several timing parameters dictate how quickly successive reads in a burst can occur. Timing parameter tREA represents the worst-case read-enable-to-access time, i.e., the delay between when memory controller 100 takes RE# low and when memory device 200 begins to drive Dout N onto the I/O bus. Timing parameter tRC represents the shortest read cycle time, i.e., time between successive reads in a burst, that can be supported by the device. Parameter tRC generally has two sub-parameters tRP and tREH as shown. Timing parameter tRP represents the minimum read pulse width, i.e., time between RE# assertion and data latching. Finally, timing parameter tREH represents the RE# high hold time, i.e., the minimum time that memory controller 100 must hold RE# high between successive read pulses.

In general, memory controllers can support a higher bus operating speed than supported by a NAND flash memory, particularly for low-voltage flash memory. A NAND flash memory with a reduced read cycle time would therefore be advantageous in speeding overall system performance. In the conventional approach, the pulse width, tRP, cannot be reduced below the access time tREA or else the memory controller will latch erroneous data before the memory device has driven the requested data to the memory controller.

DETAILED DESCRIPTION OF THE EMBODIMENTS

The present invention includes flash memory device, method, and system embodiments that implement what is referred to as a pipelined burst read. In the pipelined burst read, the memory controller requires two read enable assertions to read a memory cell. The first assertion causes the flash memory to drive a requested data word (where a word is defined according to the bus width) onto the data bus. The memory controller does not, however, latch the requested data word until it asserts read enable a second time. When the flash memory receives the second read enable, it is permitted to begin driving a next requested data word onto the data bus. Accordingly, a full read cycle is allowed between when a data word is requested and when the data word is expected to be valid, as opposed to a half read cycle (tRP) required in FIG. 2. Thus for the same bus driver characteristics, the read-enable-to-access time (tREA) is much less critical in the pipelined burst read than in a non-pipelined burst read, allowing the memory device to support burst rates of several times the non-pipelined burst read rate. As another advantage, some embodiments can support both non-pipelined and pipelined read operations, as instructed by the memory controller, using the same signal lines.

Figure 3:
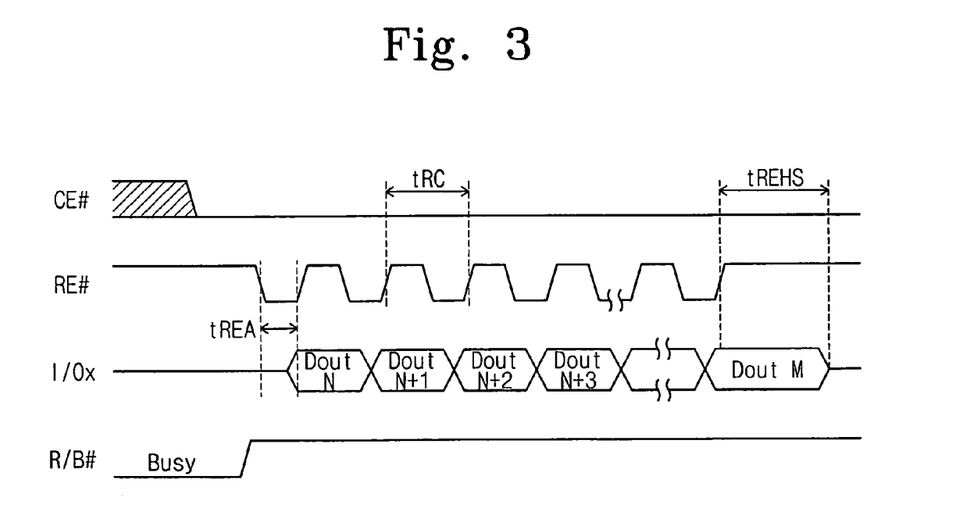
FIG. 3 illustrates a flash memory pipelined burst read operation according to some embodiments of the present invention.

FIG. 3 illustrates a basic pipelined burst read as implemented in some embodiments of the present invention. Like in FIG. 2, after a page read from the memory array completes, the memory device allows R/B# to return to a high state. The memory controller is then allowed to drive RE# low, causing the memory device to drive Dout N onto the I/O bus after a tREA access time. Unlike in FIG. 2, however, the memory controller does not expect Dout N to be valid after a read pulse tRP time (when RE# is driven high). Instead, the memory controller latches Dout N as it asserts RE# for a second time, i.e., tRC after the first assertion of RE#.

When the flash memory device receives the second assertion of RE#, it begins a second access cycle, this time for Dout N+1. In the expected pipelined operating mode, the memory device output drivers never enter a high-z state during the burst operation, but transition directly from one data word to the next data word on successive RE# assertions. Thus Dout N+1 is not latched to the memory controller until a third assertion of RE#. This pattern continues for each successive data word read.

As the memory device drives each data word until a succeeding RE# pulse is received, some provision is generally required for ending the burst operation. In some embodiments, this condition is handled by returning the memory device output drivers to a high-z state if a specified maximum RE# high hold time tREHS is exceeded. In other words, in FIG. 3, Dout M is not guaranteed to be valid if RE# has returned high for longer than tREHS seconds. The memory controller can handle this condition by either: a) ensuring that it latches Dout M, without transmitting an additional RE# pulse, after tRC seconds from the last RE# assertion but prior to tREHS seconds after the last RE# deassertion; or b) issuing an additional RE# pulse to latch Dout M, and then ignoring Dout M+1 that will be placed on the data bus due to the additional RE# pulse.

Figure 4:
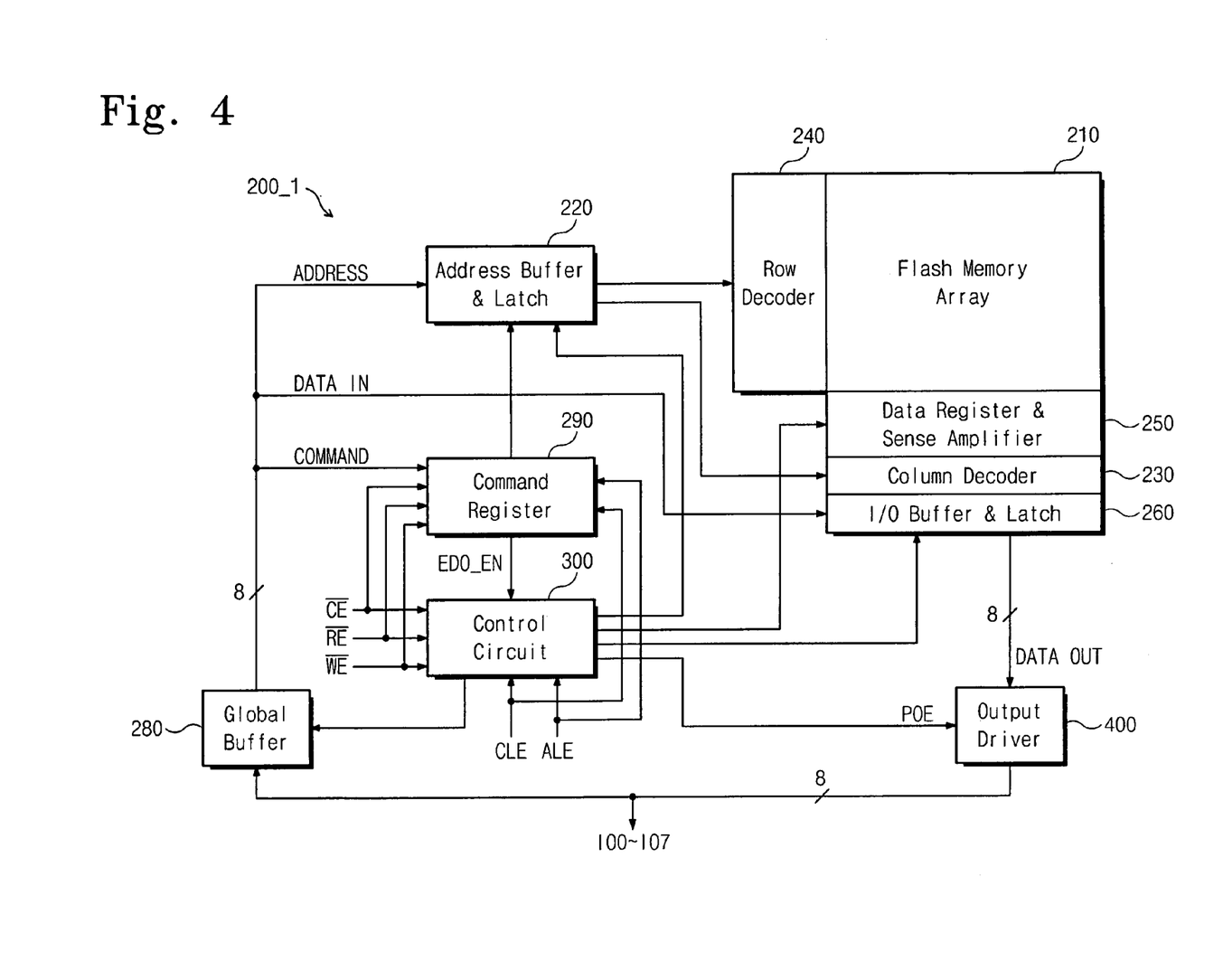
FIG. 4 contains a block diagram for a flash memory device according to some embodiments of the present invention.

With the preceding introduction of pipelined burst read operation complete, specific circuit embodiments useful for pipelined burst read can now be described. FIG. 4 shows a flash memory device 200-1 according to one embodiment of the present invention. Flash memory device 200-1 includes a flash memory array 210, address buffer and latch 220, column decoder 230, row decoder 240, data register and sense amplifier 250, I/O buffer and latch 260, global buffer 280, control circuit 300, and output driver 400.

Many of the blocks of flash memory device 200-1 function in a similar manner to their function in a prior art device. The operation of control circuit 300 and output driver 400 are modified, however, to provide a pipelined burst read operation. In some embodiments, other blocks are also modified to provide pipelined burst read operation features. The specific blocks affected by various embodiments of the invention will be described in detail, along with description of the unaffected blocks as necessary for a full understanding of the present invention. It is expected that those skilled in the art are familiar with the general operation of, for instance, flash memory cells, blocks, column and row decoders, sense amplifiers, etc., and an understanding of the detailed operation of these elements is not critical to the present invention.

Figure 5:
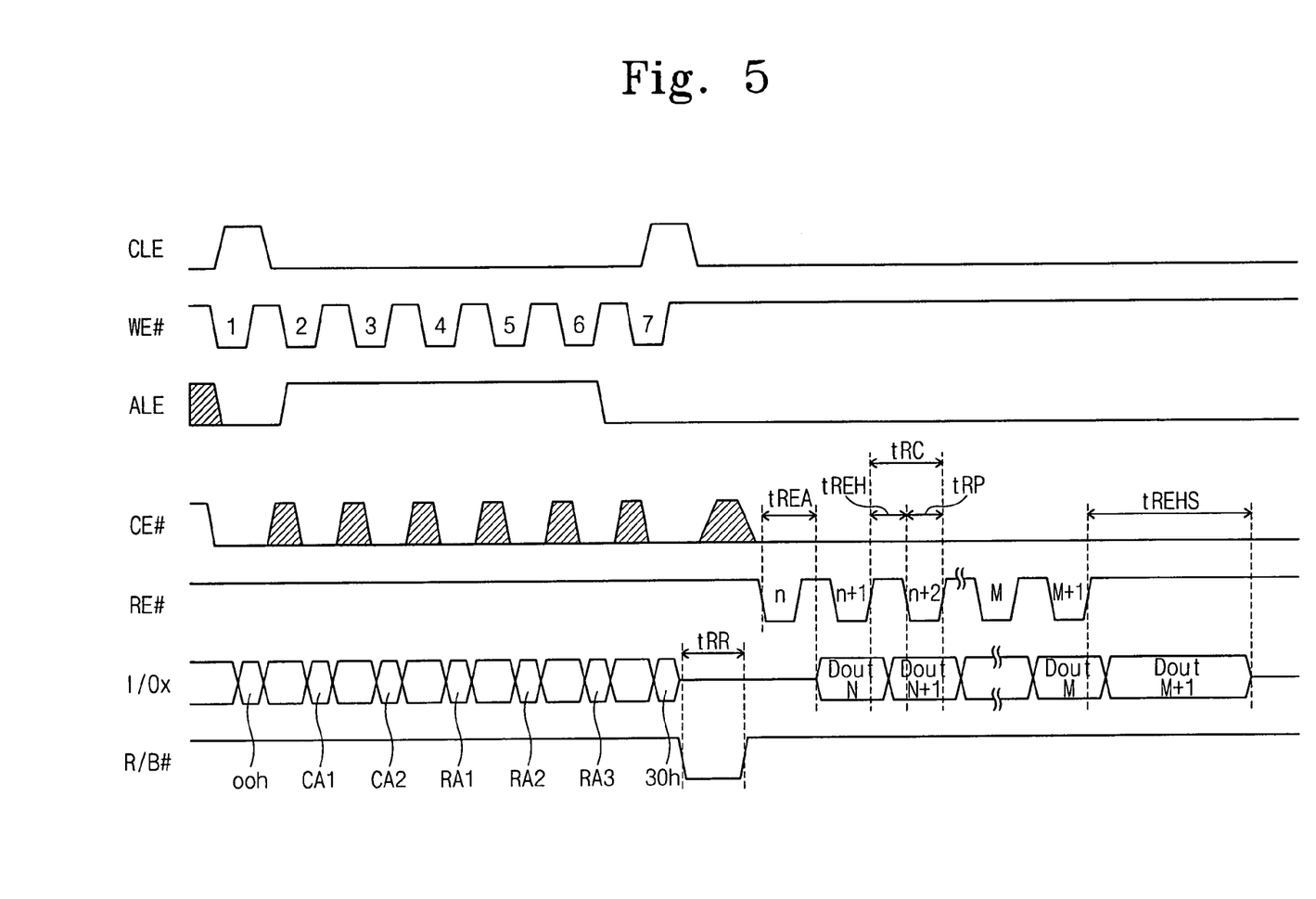
FIG. 5 contains a timing diagram for a complete pipelined burst read operation according to some embodiments of the present invention.

A description of a pipelined burst read operation for the flash memory device 200-1 will now be described with reference to the timing diagram of FIG. 5.

Control circuit 300 latches the value present on the I/O port into global buffer 280 on a low-to-high WE# transition when CE# is low. Thus at the trailing edge of write pulse 1, a value 00h (where h indicates hexadecimal notation) is latched into global buffer 280. Also, because CLE is asserted high when this data is latched, the data is interpreted as a command and transferred from global buffer 280 to command register 290.

At the trailing edges of writes pulses 2, 3, 4, 5, and 6, CE# is low and ALE is high, indicating that the data being transferred on the I/O bus is address data. According to the address convention for this exemplary device, two cycle column address descriptors CA1 and CA2 are received for write pulses 2 and 3, respectively, and three cycle row address descriptors RA1, RA2, and RA3 are received for write pulses 4, 5, and 6, respectively. Based on ALE being asserted high, these descriptors are interpreted properly as address descriptors and transferred from global buffer 280 to address buffer and latch 220. These address format conventions can be varied from device to device based on I/O bus width, memory array row, column, and page sizes, etc.

Once the address descriptors have been loaded to address buffer and latch 220, a data operation can be performed. In FIG. 5, write enable pulse 7 is used in conjunction with a second assertion of CLE to transfer a read command 30h to command register 290. In response to the read command, memory device 200-1 pulls R/B# low to indicate that it is busy, and then initiates a page read from flash memory array 210 using the supplied row address RA and column address CA. The requested page is transferred to I/O buffer and latch 260, and a word pointer in I/O buffer and latch 260 is set to the first requested address. At this time, the requested data is ready to be transferred to the memory controller. Accordingly, R/B# is allowed to return to a high value.

Some time after the memory controller senses that R/B# is high, it pulses RE# with an nth read-enable pulse while CE# is held low. Control circuit 300 interprets the falling edge of read-enable pulse n as a request to drive the currently pointed-to data word (Dout N, appearing on an internal Data Out bus) in I/O buffer and latch 260 onto the I/O bus. Control circuit responds by asserting a pipelined output enable signal POE to output driver 400. Output driver 400 responds by driving the value Dout N from the Data Out bus onto the I/O bus, with the data appearing tREA seconds after assertion n of RE#. In this example tREA is shown as greater than tRP, but this is not strictly necessary because data will not be read for at least tRC seconds after assertion n of RE#. Parameter tREA must, however, be less than IRC to ensure proper operation.

After pulsing RE# low for at least tRP seconds and then holding RE# high for at least tREH seconds, the memory controller can drive RE# low again provided at least tRC seconds have passed since the falling edge of read enable pulse n. The memory controller initiates a read-enable pulse n+1 while latching data Dout N from the I/O bus.

Control circuit 300 detects the falling edge of read-enable pulse n+1, and signals I/O buffer and latch 260 to increment its internal pointer to Dout N+1 and place Dout N+1 on the Data Out bus. Internal pipelined output enable signal remains asserted during this operation, such that output driver 400 transitions to driving Dout N+1 without ever entering a high-z state.

Assuming that read-enable pulse n+1 has met the conditions described above for a valid read-enable pulse n, the memory controller can drive a new read enable pulse n+2 to the memory device. The memory controller can latch data Dout N+1 from the I/O bus while initiating read enable pulse n+2.

The pipelined burst read operation can continue in this manner until the memory controller has received the last data value that it needs (either Dout M or Dout M+1). The following description illustrates at least one method for ending the pipelined burst read operation.

Approximately simultaneously with the falling edge of an m+1th read-enable pulse, the memory controller latches Dout M from the I/O bus. The memory device interprets the m+1th read-enable pulse as a request, intended or not, for it to drive Dout M+1 onto the I/O bus. The memory device thus drives Dout M+1 onto the I/O bus and awaits an m+2th read-enable pulse that is not forthcoming.

The memory controller can choose to ignore Dout M+1, or to latch Dout M+1 if it can do so during the data valid period without initiating an m+2th read-enable pulse. Meanwhile, control circuit 300 has detected the rising edge of the m+1th read-enable pulse and is marking the passage of time. Once a time period tREHS passes without an m+2th read-enable pulse falling edge being detected, control circuit 300 deasserts POE, causing output driver 400 to enter a high-z state. The memory controller need only hold RE# high for tREHS seconds to ensure that the memory device has released the I/O bus, and then the memory controller can initiate a new command.

Figure 6:
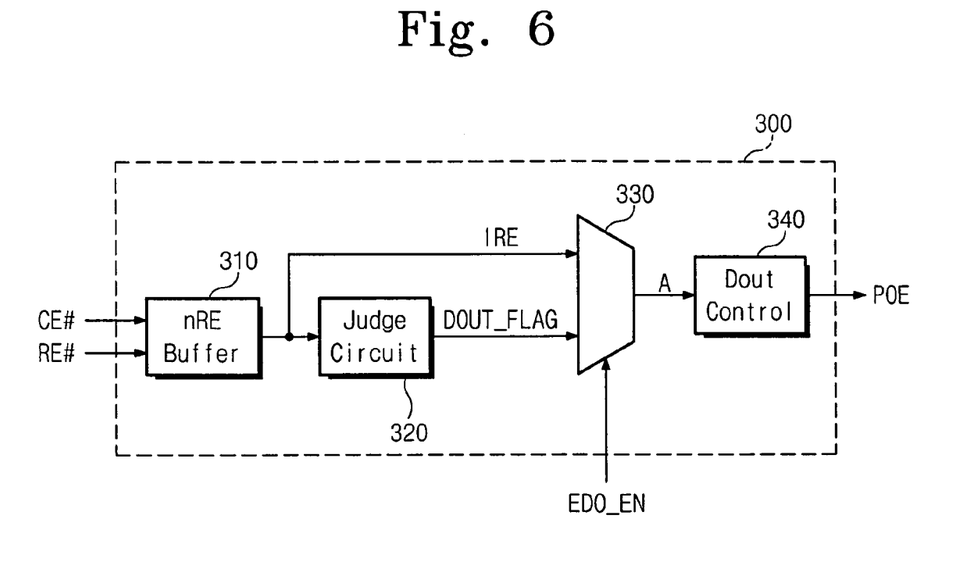
FIG. 6 illustrates details for one embodiment of the control circuit of FIG. 4.

FIG. 6 illustrates the portion of the circuitry, within control circuit 300, that is used to generate the POE output enable signal to output driver 400 in some embodiments of the present invention. To this end, control circuit 300 comprised an nRE buffer 310 to generate an internal read enable signal IRE based on CE# and RE#, a judge circuit 320 that receives IRE as its input, a 2:1 multiplexer 330 to select one of IRE and the output of judge circuit 320 based on a mux select signal EDO_EN, and a Dout (Data out) control circuit 340 to create output enable signal POE based, at least in part, on the output of multiplexer 330. The function of each of these blocks will be described in turn.

Figure 7:
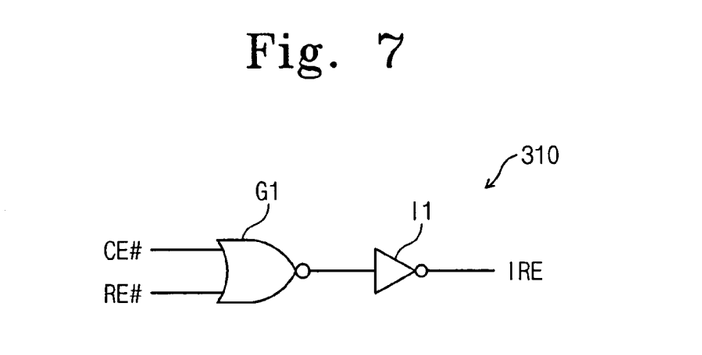
FIG. 7 shows one embodiment of the nRE buffer of FIG. 6.

FIG. 7 shows one embodiment of nRE buffer 310, comprising a two-input NOR gate G1, an inverter I1. The external signals CE# and RE# are coupled, respectively, to the two inputs of NOR gate G1. The output of NOR gate G1 is supplied to the input of inverter I1, and the output of inverter I1 is supplied as internal read enable signal IRE.

In operation, IRE is asserted low whenever both CE# and RE# are asserted low. Assuming that CE# is held low by the memory controller for the duration of an RE# pulse, IRE will mirror RE#.

Figure 8:
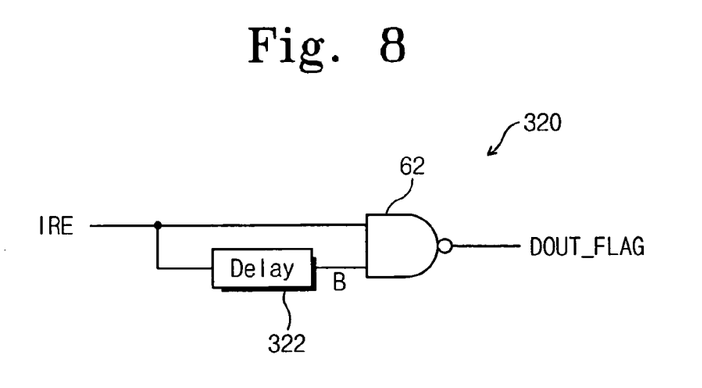
FIG. 8 shows one embodiment of the judge circuit of FIG. 6.

FIG. 8 shows one embodiment of judge circuit 320, comprising a delay element 322 and a two-input NAND gate G2. Internal read enable signal IRE is supplied as an input to delay element 322 and as one input to NAND gate G2. The output of delay element 322, shown as signal "B," is supplied as the second input to NAND gate G2. NAND gate G2 generates a signal DOUT_FLAG.

In operation, DOUT_FLAG remains asserted high as long as at least one of IRE and B is low. Assuming that IRE has been high for longer than the delay period, this circuit responds to IRE going low by driving DOUT_FLAG high. Assuming that the delay of element 322 is shorter than the low pulse on IRE, signal B will go low before IRE returns to high, thus holding DOUT_FLAG high. If IRE is again pulsed low before signal B follows IRE high, DOUT_FLAG remains high. Under these conditions, DOUT_FLAG will stay high indefinitely as long as IRE continues to toggle, and will only return to a low value if signal IRE returns high and stays high for longer than the delay period of element 322.

Other embodiments of judge circuit 322 are possible. Functionally, the judge circuit should enable the data output upon receiving a first read enable pulse, and continue to enable the data output as long as the read enable signal continue to toggle at least once in a period tREHS. When an entire period tREHS is observed without a new read enable signal appearing, the judge circuit changes its state to low. The length of period tREHS is a design parameter that can be set to provide correct operation in a desired range of read cycle times.

Figure 9:
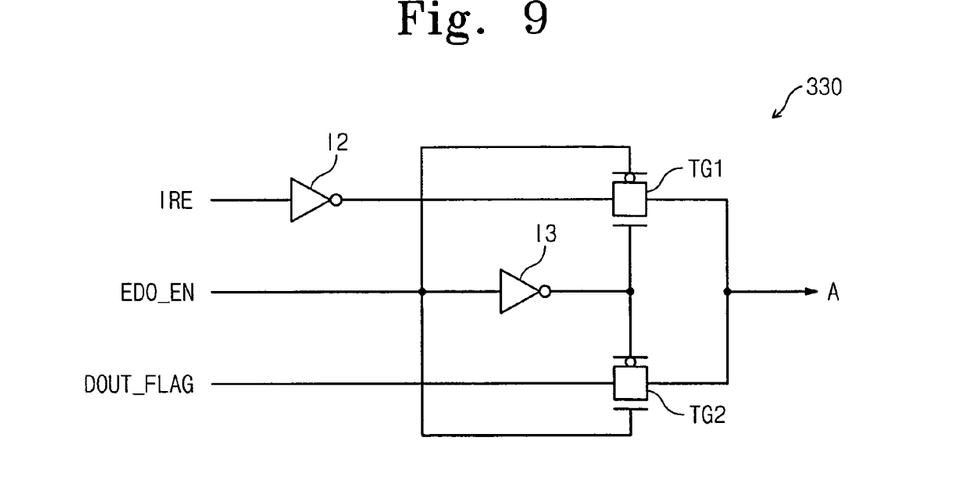
FIG. 9 contains a circuit diagram for one embodiment of the multiplexer of FIG. 6.

FIG. 9 illustrates one embodiment of multiplexer 330, including inverters I2 and I3 and transmission gates TG1 and TG2. I2 inverts input signal IRE and supplies the inverted signal to the input of transmission gate TG1. Input signal DOUT_FLAG is supplied to the input of transmission gate TG2. The outputs of transmission gates TG1 and TG2 are tied together at an output A.

I3 inverts the control signal EDO_EN. EDO_EN and the inverter I3 output are supplied to the control gates of TG1 such that TG1 passes its input to output A when EDO_EN is low. EDO_EN and the inverter I3 output are supplied in complementary fashion to the control gates of TG2 such that TG2 passes its input to output A when EDO_EN is high. Accordingly, EDO_EN selects either IRE (inverted) or DOUT_FLAG as output A.

EDO_EN can be used advantageously to switch between two burst read operating modes. When EDO_EN is low, burst read operations similar to the prior art are performed. When EDO_EN is high, pipelined burst read operations are performed.

Figure 10:
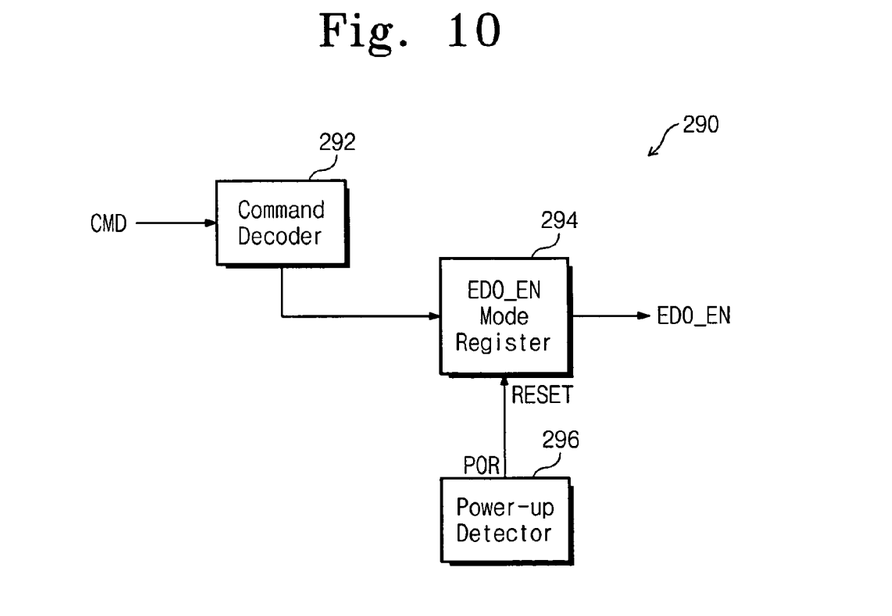
FIG. 10 shows in block diagram form circuitry for setting a burst read operation mode according to some embodiments of the present invention.

Several methods can be used to control EDO_EN. In a simple approach, a dedicated external memory device pin can be tied to $V_{CC}$ or $V_{SS}$, or tied to a switchable input. Preferably, however, EDO_EN can be controlled from the memory controller using the existing signal lines. In one approach, shown in FIG. 10, command register 290 contains a command decoder 292, an EDO_EN mode register 294, and a power-up detector 296. Power-up detector 296 generates a POR signal during the power-up period. The POR signal sets EDO_EN mode register 294 to a logic low state (or, if desired in a particular application, a logic high state), such that the device is in a determinate burst read mode state. Subsequently, if command decoder 292 receives a command signal CMD indicating that the memory controller desires to use a first burst read operation type, command decoder 292 sets EDO_EN mode register 294 to a logic low state. Also, if command decoder 292 receives a command signal CMD indicating that the memory controller desires to use a second burst read operation type, command decoder 292 sets EDO_EN mode register 294 to a logic high state. The command signal CMD can be a dedicated mode-setting command. Alternately, two different read command types can be used; when the memory controller issues the first read command type, EDO_EN mode register 294 is set to a logic low state, and when the memory controller issues the second read command type EDO_EN mode register 294 is set to a logic high state.

Figure 11:
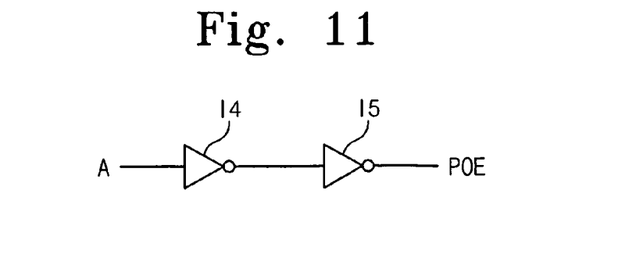
FIG. 11 depicts one embodiment of the Dout control circuit of FIG. 6.

FIG. 11 illustrates one embodiment of Dout control circuit 340 shown in FIG. 6. In this simple embodiment, Dout control circuit 340 consists of two serial inverters I4 and I5, which merely buffer output A from multiplexer 330 to provide output enable signal POE. Thus when multiplexer 330 selects inverted IRE, output enable POE is high when both CE# and RE# are low, and low otherwise. The output driver is thus controlled according to FIG. 2, having a DATA state when RE# is low (and the chip is selected) and a high-z state otherwise. When multiplexer 330 selects DOUT_FLAG, output enable POE transitions to high when both CE# and RE# are low, placing the output driver in a DATA state. POE persists in a high state as long as RE# toggles (while the chip is selected) within a time tREHS. POE continues to persist in a high state for tREHS seconds after the last positive transition of RE#, and then reverts to a low state (placing the output driver in a high-z state).

Figure 12:
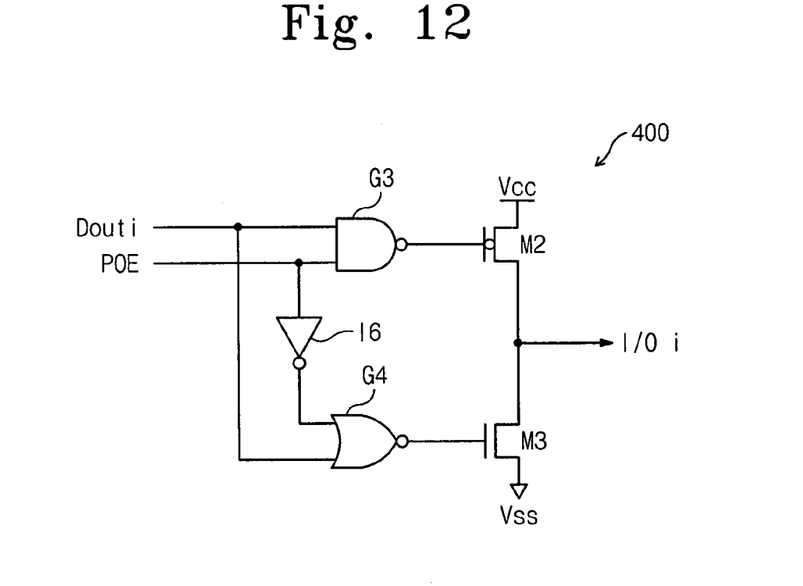
FIG. 12 contains an exemplary circuit diagram for one bit lane of the output driver of FIG. 4.

FIG. 12 illustrates one possible implementation of one bit lane i of output driver 400, with other bit lanes implemented in similar fashion. Bit lane i output driver comprises a two-input NAND gate G3, an inverter I6, a two-input NOR gate G4, a p-channel drive transistor M2, and an n-channel driver transistor M3. Data out bit lane value Douti from I/O buffer and latch 260 is supplied to one input of gates G3 and G4. Output enable POE from control circuit 300 is supplied to the other input of NAND gate G3, and to the input of inverter I6. The output of inverter I6 is supplied as the second input to NOR gate G4.

The output of NAND gate G3 drives the gate of p-channel drive transistor M2, and the output of NOR gate G4 drives the gate of n-channel drive transistor M3. P-channel drive transistor M2 has its source connected to $V_{CC}$ and its drain connected to input/output bus line I/Oi. N-channel drive transistor M3 has its source connected to $V_{SS}$ and its drain connected to input/output bus line I/Oi. Accordingly, when M2 is on I/Oi is pulled high, when M3 is on I/O is pulled low, and when M2 and M3 are both off the output driver is in a high-z state.

The output driver circuit operates as follows. When POE is low, NAND gate G3 has a high output no matter what the state of Douti, and thus p-channel drive transistor M2 is off. Also when POE is low, NOR gate G4 has a low output no matter what the state of Douti, and thus n-channel drive transistor M3 is also off, and the output driver is in a high-z state.

When POE is high, driver output is determined by Douti. Thus when Douti is also high, NAND gate G3 generates a low output, causing drive transistor M2 to pull I/Oi high. And when Douti is low, NOR gate G4 generates a high output, causing drive transistor M3 to pull I/Oi low. As POE can be controlled according to either pipelined or non-pipelined burst modes, output driver 400 can support both modes as well.

Figure 13:
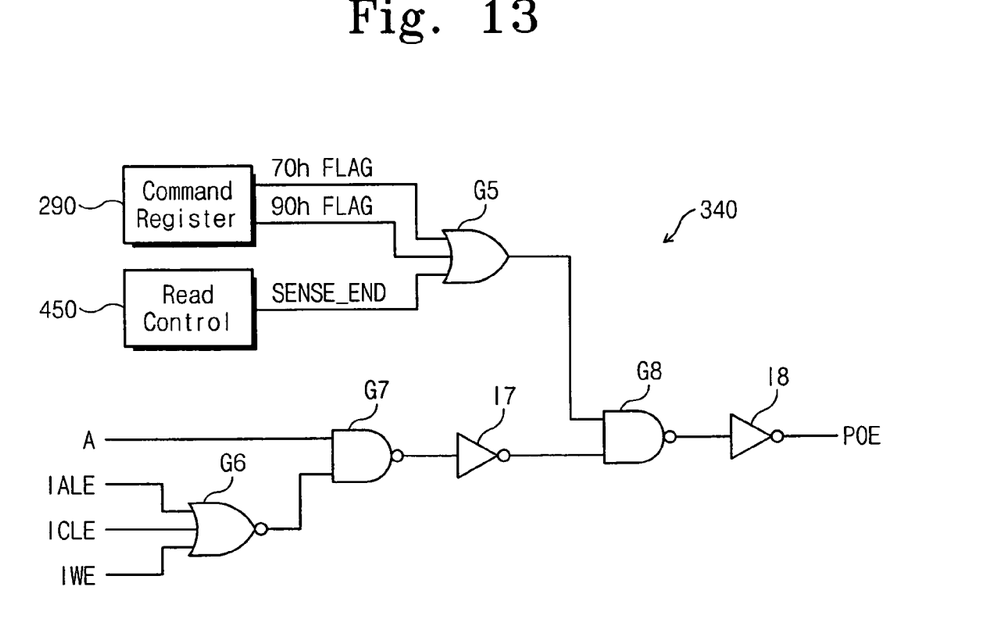
FIG. 13 contains a circuit diagram for an alternate embodiment of the Dout control circuit of FIG. 6.

Many of the functional blocks described above can incorporate other functionality. For instance, Dout control 340 shown in FIG. 6 can use other state information to control POE in addition to multiplexer 330 output A. FIG. 13 illustrates such an embodiment, comprising a three-input OR gate G5, a three-input NOR gate G6, two two-input NAND gates G7 and G8, and two inverters I7 and I8.

In FIG. 13, POE is disabled until output data is ready. In a normal read from flash memory array 210, a read control circuit 450 indicates that data is available by asserting a signal SENSE_END. Also, the memory controller can issue a 70h command to request state information, e.g., did the last program or erase function complete normally. Since this data does not have to be read from the memory array, command register 290 can assert a 70h flag to indicate that the state information is ready to be driven on the I/O bus. The memory controller can also issue a 90h command to request device ID information such as a maker code, device code, chip number, cell type, page size and spare size, and data organization.

Since this data does not have to be read from the memory array, command register 290 can assert a 90h flag to indicate that the ID information is ready to be driven on the I/O bus.

OR gate G5 ors the 70h flag, 90h flag, and SENSE_END signals. NAND gate G8 with serial inverter I8 and the output of OR gate G5 with what would otherwise be the POE signal to produce a POE signal that cannot be asserted unless one of the 70h flag, 90h flag, and SENSE_END signals is asserted. Accordingly, the output drivers remain in a high-z state if the memory controller requests a read operation when data is not ready to be transferred.

Dout control 340 of FIG. 13 also contains circuitry to disable POE when the memory controller is attempting to drive data on the I/O bus. NOR gate G6 ors internal address latch enable signal IALE, internal command latch enable signal ICLE, and internal write enable signal IWE, and supplies its output to one input of NAND gate G7 with serial inverter I7. Multiplexer 330 output signal A is supplied to the other input of NAND gate G7. Accordingly, POE is disabled when the memory controller is attempting to drive data on the I/O bus.

The above embodiments are merely exemplary. Other flash memory features not described herein can be combined with the above embodiments. Not all features shown above need exist in every embodiment. For instance, multiplexer 330 and its associated circuitry are not needed when the flash memory device does not need to support a non-pipelined burst read operation. The particular partitioning of circuit functionality shown is illustrative of one approach, but other architectural arrangements are also possible.

Many alternate implementations exist for the exemplary components described herein. Such minor modifications and implementation details are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A flash memory device comprising:
   an output buffer to supply a data out signal in response to an assertion of a read enable signal;
   a judge circuit to assert an output flag signal in response to the assertion of the read enable signal, the judge circuit deasserting the output flag signal when the read enable signal remains deasserted for at least a hold time; and
   a tri-state output driver coupled to the data out signal and an output enable signal, the driver driving the data out signal onto an output node when the output enable signal is asserted, the driver presenting a high impedance at the output node otherwise,
   wherein in at least one read mode the output enable signal is responsive to the output flag signal.

2. The flash memory device of claim 1, further comprising:
   a multiplexer having a multiplexer output that is selectable, based on a read mode input signal, from a first and a second signal input, the first signal input coupled to the output flag signal, the second input coupled to the read enable signal, wherein the output enable signal is responsive to the multiplexer output.

3. The flash memory device of claim 2, wherein the multiplexer comprises:
   a first transmission gate having an input connected to the first signal input, an output connected to the multiplexer output, and a control gate connected to turn the first transmission gate on when the read mode input signal is in a first logic state; and
   a second transmission gate having an input connected to the second signal input, an output connected to the multiplexer output, and a control gate connected to turn the second transmission gate on when the read mode input signal is in a second logic state.

4. The flash memory device of claim 2, further comprising a programmable mode register to generate the read mode input signal.

5. The flash memory device of claim 4, wherein the programmable mode register is programmable in response to a mode register command received by the device during operation, the programmable mode register having reset logic to set the register state upon device power-up.

6. The flash memory device of claim 2, further comprising a data output control circuit to receive the multiplexer output and generate the output enable signal.

7. The flash memory device of claim 6, having the capability to perform register read operations and data array read operations, wherein the data output control circuit allows the output enable signal to respond to the multiplexer output both when a register read is requested and when an array read is requested and array data is ready for output as the data out signal.

8. The flash memory device of claim 1, further comprising a read enable buffer to assert the read enable signal when an external chip enable signal and an external read enable signal are both asserted.

9. A flash memory device comprising:
   an output buffer to supply a data out signal in response to an assertion of a read enable signal;
   a programmable mode circuit to generate a read mode input signal capable of indicating at least two read modes, including a pipelined read mode and a non-pipelined read mode;
   a control circuit to generate an output enable signal based on the read mode input signal and the read enable signal, wherein in the non-pipelined read mode a deassertion of the output enable signal is triggered in response to a deassertion of the read enable signal, and wherein in the pipelined read mode a deassertion of the output enable signal is triggered by the output enable signal remaining deasserted for a hold time; and
   a tri-state output driver coupled to the data out signal and the output enable signal, the driver driving the data out signal onto an output node when the output enable signal is asserted, the driver presenting a high impedance at the output node otherwise.

10. The flash memory device of claim 9, wherein the programmable mode circuit is programmable via mode register set commands received by the flash memory device during operation.

11. The flash memory device of claim 9, wherein the programmable mode circuit defaults to generating a read mode input signal indicative of the non-pipelined read mode upon flash memory device power-up.

12. The flash memory device of claim 9, wherein the programmable mode circuit defaults to generating a read mode input signal indicative of the pipelined read mode upon flash memory device power-up.

13. A memory system comprising:
   a memory controller having a read enable output that is asserted to a device to cause the device to transmit read data to the memory controller;
   a multiplexed memory bus to transmit address, command, and write data from the memory controller and to transmit read data to the memory controller; and
   a flash memory device connected to the multiplexed memory bus and to the read enable output signal, the flash memory device having a pipelined burst read mode wherein
      the flash memory device transmits read data n to the memory controller until a set time after receiving an n+1th assertion of the read enable output, at which time the flash memory device begins transmitting read data n+1 to the memory controller, and
      the flash memory device stops transmitting read data n to the memory controller and releases the multiplexed memory bus when an n+1th assertion of the read enable output is not received within a hold time after the nth deassertion of the read enable output.

14. The memory system of claim 13, wherein the flash memory device has a memory array having a NAND storage node array structure.

15. The memory system of claim 13, wherein the flash memory device also has a non-pipelined burst read mode, wherein the flash memory device has the capability to operate in either the pipelined or the non-pipelined burst read mode.

16. The memory system of claim 15, wherein the memory controller has the capability to transmit commands to the flash memory device to select either the pipelined or the non-pipelined burst read mode.

17. The memory system of claim 15, wherein the flash memory device defaults to the non-pipelined burst read mode upon power-up.

18. The memory system of claim 15, wherein the flash memory device defaults to the pipelined burst read mode upon power-up.

19. A flash memory device operating method comprising:
in response to a first read enable assertion, driving a requested data word at a flash memory device output either
until a second read enable assertion causes the device to drive a next requested data word onto the flash memory device output, or
until a hold time after the deassertion of the first read enable assertion, at which time the flash memory device output is placed in a high impedance state.

20. The method of claim 19, wherein the claimed response to a first read enable assertion exists in a first read mode, the device having a second read mode comprising:
in response to a first read enable assertion, driving a requested data word at a flash memory device output until the first read enable is deasserted.

21. The method of claim 20, further comprising selecting the first or second read mode in response to a mode register set command.

22. The method of claim 20, further comprising selecting the second read mode as a default mode upon device power-up.

23. A method for operating a memory system comprising a flash memory device, a memory controller, and a bus connecting the flash memory device and the memory controller, the method comprising:
the memory controller asserting a read enable signal an nth time to the flash memory device;
the memory controller deasserting the read enable signal an nth time;
the memory device placing read data n on the bus in response to read enable signal assertion n;
the memory controller asserting the read enable signal an n+1th time to the flash memory device and reading read data n off of the bus;
the memory controller deasserting the read enable signal an n+1th time;
the memory device replacing read data n with read data n+1 on the bus in response to read enable signal assertion n+1;
the memory controller reading read data n+1 off of the bus; and
the memory device removing read data n+1 from the bus and placing the device's bus connection in a high-impedance state a hold time after receiving read enable signal deassertion n+1.

24. The method of claim 23, further comprising additional read enable signal assertions and deassertions arranged with the nth and n+1th assertions and deassertions in a common burst read operation.

25. The method of claim 23, further comprising:
initiating a command at the memory controller some time prior to the nth read enable signal assertion to request a pipelined read operation mode; and
configuring the memory device to operate according to claim 20 in response to the command.

26. A nonvolatile memory device comprising:
a tri-state output driver;
means for selecting one of a pipelined and a non-pipelined burst read operation modes; and
control means, for controlling the operation of the tri-state output driver responsive to the selected burst read operation mode.

27. The nonvolatile memory device of claim 26, wherein the selecting means comprises a register that is settable by commands issued from an external device.

* * * * *

UNITED STATES PATENT AND TRADEMARK OFFICE
CERTIFICATE OF CORRECTION

PATENT NO. : 7,079,445 B2 Page 1 of 1
APPLICATION NO. : 10/852841
DATED : July 18, 2006
INVENTOR(S) : Soo-Hwan Choi et al.

It is certified that error appears in the above-identified patent and that said Letters Patent is hereby corrected as shown below:

Column 5, line 12 the word "IRC" should read -- tRC --.

Signed and Sealed this

Eighteenth Day of August, 2009

David J. Kappos
*Director of the United States Patent and Trademark Office*